(12) United States Patent
Yamashiro

(10) Patent No.: US 11,961,661 B2
(45) Date of Patent: Apr. 16, 2024

(54) SUPERCONDUCTING MAGNET

(71) Applicant: Mitsubishi Electric Corporation, Tokyo (JP)

(72) Inventor: Dai Yamashiro, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 194 days.

(21) Appl. No.: 17/616,844

(22) PCT Filed: Jul. 10, 2019

(86) PCT No.: PCT/JP2019/027335
§ 371 (c)(1),
(2) Date: Dec. 6, 2021

(87) PCT Pub. No.: WO2021/005749
PCT Pub. Date: Jan. 14, 2021

(65) Prior Publication Data
US 2022/0310294 A1 Sep. 29, 2022

(51) Int. Cl.
*H01F 6/06* (2006.01)
*H01F 6/02* (2006.01)
*H01F 6/04* (2006.01)

(52) U.S. Cl.
CPC ............... *H01F 6/02* (2013.01); *H01F 6/04* (2013.01); *H01F 6/06* (2013.01)

(58) Field of Classification Search
CPC .... H01F 6/02; H01F 6/04; H01F 6/06; H10N 60/81
See application file for complete search history.

(56) References Cited

U.S. PATENT DOCUMENTS

| | | | |
|---|---|---|---|
| 5,598,710 A | 2/1997 | Tomeoku et al. | |
| 2009/0280989 A1* | 11/2009 | Astra | G05D 23/1919 62/51.1 |

(Continued)

FOREIGN PATENT DOCUMENTS

| | | |
|---|---|---|
| CN | 1737952 A | 2/2006 |
| JP | S61173625 A | 8/1986 |
| JP | S62112109 U | 7/1987 |

(Continued)

OTHER PUBLICATIONS

International Search Report (PCT/ISA/210) with translation and Written Opinion (PCT/ISA/237) dated Sep. 17, 2019, by the Japan Patent Office as the International Searching Authority for International Application No. PCT/JP2019/027335.

*Primary Examiner* — Mohamad A Musleh
(74) *Attorney, Agent, or Firm* — BUCHANAN INGERSOLL & ROONEY PC

(57) ABSTRACT

A discharge pipe is connected to a refrigerant container from outside of a vacuum container, and discharges a vaporized refrigerant. A pair of external leads are electrically connected respectively to opposite ends of a superconducting coil from a position outside of the vacuum container, so as to cause a current to flow through the superconducting coil. A protection circuit is electrically connected to the superconducting coil, and consumes energy stored in the superconducting coil during quenching. The protection circuit is in contact with the discharge pipe outside of the vacuum container.

3 Claims, 4 Drawing Sheets

(56) References Cited

U.S. PATENT DOCUMENTS

2016/0233011 A1* 8/2016 Eguchi ..................... H01F 6/00
2018/0040402 A1* 2/2018 Eguchi ..................... H01F 6/04

FOREIGN PATENT DOCUMENTS

| JP | H05343753 A | 12/1993 |
| JP | H0669554 A | 3/1994 |
| JP | H07183116 A | 7/1995 |
| JP | H0818112 A | 1/1996 |
| JP | 2551875 B2 * | 11/1996 |

* cited by examiner

SUPERCONDUCTING MAGNET

TECHNICAL FIELD

The present invention relates to a superconducting magnet.

BACKGROUND ART

Japanese Utility Model Laying-Open No. 62-112109 (PTL 1) is a document disclosing a configuration of a superconducting magnet. In the superconducting magnet described in PTL 1, a gas helium region is formed above a liquid helium region within a cryostat. The gas helium region cools a diode and a heat sink. In the superconducting magnet described above, if a persistent current switch quenches, the persistent current switch transitions to the normal conducting state, causing a voltage to be generated across the switch. However, the persistent current switch is not damaged since the diode becomes conductive. At this time, heat generated in the diode is transferred to the heat sink, and furthermore, the heat sink is cooled by sensible heat of low-temperature gas helium present in the gas helium region.

CITATION LIST

Patent Literature

PTL 1: Japanese Utility Model Laying-Open No. 62-112109

SUMMARY OF INVENTION

Technical Problem

In a conventional superconducting magnet, a protection circuit is provided in a narrow portion within a sealed space where cooling gas is present. Therefore, it has been a difficult task to assemble the protection circuit. The protection circuit also requires an additional member for heat exchange.

The present invention has been made in view of the above problem, and aims to provide a superconducting magnet that does not require any member used only for heat exchange, and that allows for easy assembly of a protection circuit having a simple configuration.

Solution to Problem

A superconducting magnet based on the present invention includes a superconducting coil, a refrigerant container, a vacuum container, a discharge pipe, a pair of external leads, and a protection circuit. The refrigerant container contains the superconducting coil in a state where the superconducting coil is immersed in a liquid refrigerant. The vacuum container contains the refrigerant container. The discharge pipe is connected to the refrigerant container from outside of the vacuum container, and discharges the refrigerant that has been vaporized. The pair of external leads are electrically connected respectively to opposite ends of the superconducting coil from a position outside of the vacuum container, so as to cause a current to flow through the superconducting coil. The protection circuit is electrically connected to the superconducting coil, and consumes energy stored in the superconducting coil during quenching. The protection circuit is in contact with the discharge pipe outside of the vacuum container.

Advantageous Effects of Invention

According to the present invention, since the protection circuit is located outside of the vacuum container, the protection circuit is easily assembled. In addition, since the protection circuit is in contact with the discharge pipe through which refrigerant gas flows during quenching of a superconducting magnet 100, the protection circuit is cooled during the quenching by the discharge pipe that has been cooled by sensible heat of the refrigerant gas. This can eliminate the need for a member used only for heat exchange, thereby simplifying a configuration of the protection circuit.

DESCRIPTION OF EMBODIMENTS

Figure 1:
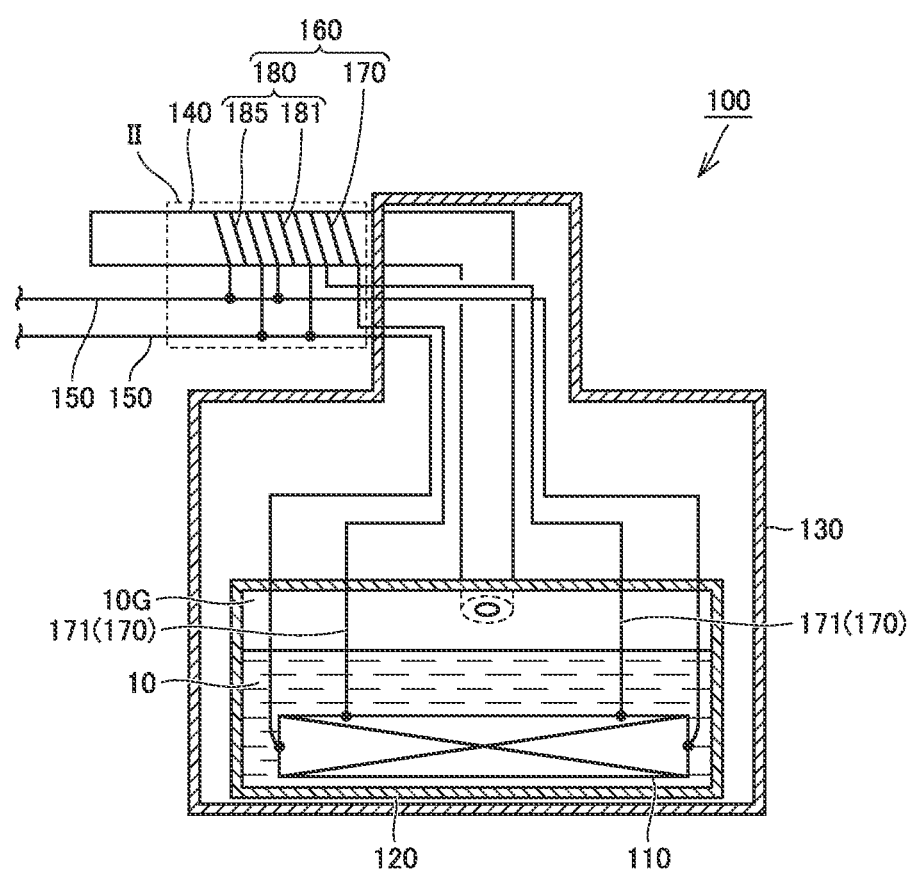
FIG. 1 is a cross-sectional view showing a configuration of a superconducting magnet according to a first embodiment of the present invention.

In the following, superconducting magnets according to embodiments of the present invention will be described with reference to the drawings. In the following description of the embodiments, the same or corresponding parts are denoted by the same reference characters in the drawings, and a description thereof is not repeated.

First Embodiment

Figure 2:
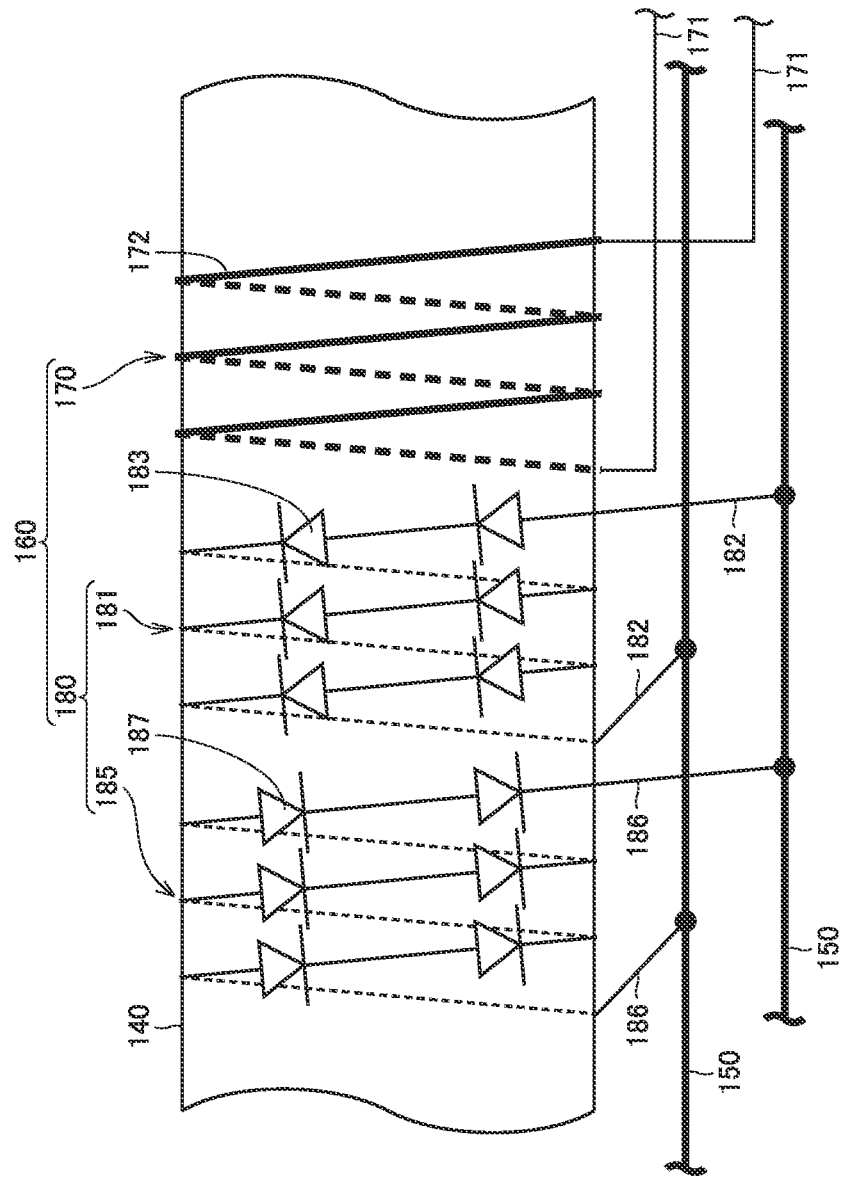
FIG. 2 is an enlarged view of a portion II of the superconducting magnet shown in FIG. 1.

FIG. 1 is a cross-sectional view showing a configuration of a superconducting magnet according to a first embodiment of the present invention. FIG. 2 is an enlarged view of a portion II of the superconducting magnet shown in FIG. 1. In FIGS. 1 and 2, the components are shown in a simplified form for the sake of simplicity.

As shown in FIGS. 1 and 2, a superconducting magnet 100 according to the first embodiment of the present invention includes a superconducting coil 110, a refrigerant container 120, a vacuum container 130, a discharge pipe 140, a pair of external leads 150, and a protection circuit 160.

Superconducting coil 110 is immersed in a liquid refrigerant 10. Superconducting coil 110 forms a persistent current circuit within refrigerant 10.

Refrigerant container 120 has a hollow cylindrical shape. FIG. 1 shows a portion of refrigerant container 120 in cross section along an axial direction of a central axis of refrigerant container 120. Refrigerant container 120 is made of stainless steel, for example.

Refrigerant container 120 contains superconducting coil 110 in a state where superconducting coil 110 is immersed in liquid refrigerant 10. Liquid refrigerant 10 is liquid helium in the present embodiment, but may be liquid nitrogen or the like. A portion in refrigerant container 120 other than superconducting coil 110 and liquid refrigerant 10 is filled with a vaporized refrigerant 10G.

Vacuum container 130 contains refrigerant container 120. Vacuum container 130 partially has a hollow cylindrical shape substantially similar to an outer shape of refrigerant container 120. The interior of vacuum container 130 is reduced in pressure to a high vacuum state in order to improve heat insulation of refrigerant container 120. More specifically, a portion from inside of vacuum container 130 to outside of refrigerant container 120 is reduced in pressure to a high vacuum state. Vacuum container 130 is made of stainless steel, for example. A radiation shield may be disposed between refrigerant container 120 and vacuum container 130.

Discharge pipe 140 is connected to refrigerant container 120 from outside of vacuum container 130. During operation of superconducting magnet 100, an end of discharge pipe 140 located outside of vacuum container 130 is closed. Discharge pipe 140 is configured such that, when a pressure in refrigerant container 120 increases excessively due to quenching of superconducting coil 110, a pressure release valve provided at the end of discharge pipe 140 opens to release vaporized refrigerant 10G in refrigerant container 120 into the atmosphere. In this manner, discharge pipe 140 discharges vaporized refrigerant 10G.

Discharge pipe 140 has an outer diameter of 15 cm or more and 20 cm or less, for example. Discharge pipe 140 is made of a metal such as stainless steel. In a portion of vacuum container 130 through which discharge pipe 140 protrudes from inside to outside of vacuum container 130, an insulating member is preferably located between discharge pipe 140 and vacuum container 130.

The pair of external leads 150 are electrically connected respectively to opposite ends of superconducting coil 110 from a position outside of vacuum container 130, so as to cause a current to flow through superconducting coil 110. The pair of external leads 150 are connected to a not-shown exciting power supply outside of vacuum container 130. Superconducting coil 110 is excited by the exciting power supply via external leads 150, and a current flows through superconducting coil 110. During the operation of superconducting magnet 100 and while the current is flowing through superconducting coil 110, the pair of external leads 150 and the exciting power supply are disconnected.

Protection circuit 160 is electrically connected to superconducting coil 110. Specifically, protection circuit 160 is connected in parallel with the whole or a portion of superconducting coil 110. If superconducting coil 110 quenches, a voltage is generated at the superconducting coil. When a voltage is generated at the superconducting coil, a current resulting from this voltage generation flows through protection circuit 160. Superconducting coil 110 is thus protected against damage. In this manner, protection circuit 160 consumes energy stored in superconducting coil 110 during the quenching.

Protection circuit 160 is in contact with discharge pipe 140 outside of vacuum container 130. In the present embodiment, protection circuit 160 is wrapped around discharge pipe 140 outside of vacuum container 130. Protection circuit 160 is fixed to discharge pipe 140 with an adhesive tape and the like.

In superconducting magnet 100 according to the first embodiment of the present invention, protection circuit 160 includes a protection resistance portion 170 that electrically connects two locations of superconducting coil 110 that are spaced from each other, and a protection diode portion 180 that electrically connects the pair of external leads 150 to each other.

As shown in FIGS. 1 and 2, protection resistance portion 170 is connected in parallel with a portion of superconducting coil 110, and is in contact with discharge pipe 140 outside of vacuum container 130. Specifically, protection resistance portion 170 is wrapped around discharge pipe 140 outside of vacuum container 130.

Protection resistance portion 170 has a resistance wire lead 171 and a resistance wire 172. Resistance wire lead 171 is connected to superconducting coil 110. Resistance wire lead 171 is drawn from inside to outside of vacuum container 130. Resistance wire 172 is provided on resistance wire lead 171 outside of vacuum container 130.

In the present embodiment, resistance wire 172 is wrapped around discharge pipe 140. Quenching of superconducting coil 110 causes a current to flow through resistance wire 172 via resistance wire lead 171. As a result, resistance wire 172 generates heat, and energy is consumed as Joule heat.

In the present embodiment, resistance wire 172 is flat. In addition, resistance wire 172 is made of a metal or an alloy having a degree of flexibility that allows itself to be wrapped around discharge pipe 140, and having a relatively high electrical resistivity. Resistance wire 172 is formed of a Nichrome wire, for example.

As shown in FIGS. 1 and 2, protection diode portion 180 is located to connect the pair of external leads 150 to each other outside of vacuum container 130. That is, protection diode portion 180 is connected in parallel with the whole of superconducting coil 110. Protection diode portion 180 is in contact with discharge pipe 140 outside of vacuum container 130, and is specifically wrapped around discharge pipe 140.

As shown in FIGS. 1 and 2, protection diode portion 180 has a first protection diode portion 181 and a second protection diode portion 185. First protection diode portion 181 is located to connect the pair of external leads 150 to each other. Second protection diode portion 185 is also located to connect the pair of external leads 150 to each other, separately from first protection diode portion 181.

As shown in FIG. 2, first protection diode portion 181 has a first protection diode lead 182 and a plurality of first diodes 183. First protection diode lead 182 connects the pair of external leads 150 to each other. The plurality of first diodes 183 are provided on first protection diode lead 182.

The plurality of first diodes 183 are connected in series with one another. The cathode side of one of two adjacent first diodes 183 is connected to the anode of the other first diode 183. In the present embodiment, first protection diode lead 182 is wrapped around discharge pipe 140 such that each of the plurality of first diodes 183 is in contact with discharge pipe 140.

Second protection diode portion 185 has a second protection diode lead 186 and a plurality of second diodes 187. Second protection diode lead 186 connects the pair of external leads 150 to each other. The plurality of second diodes 187 are provided on second protection diode lead 186.

The plurality of second diodes 187 are connected in series with one another. The cathode side of one of two adjacent second diodes 187 is connected to the anode of the other second diode 187. In the present embodiment, second protection diode lead 186 is wrapped around discharge pipe 140 such that each of the plurality of second diodes 187 is in contact with discharge pipe 140.

In the present embodiment, the cathode of first diode 183 is connected to external lead 150 connected to the anode side of second diode 187. The anode of first diode 183 is connected to external lead 150 connected to the cathode side of second diode 187. In addition, the opposite ends of second protection diode lead 186 that are connected to the pair of external leads 150 may be connected between the opposite ends of first protection diode lead 182 and first diode 183.

The plurality of first diodes 183 and the plurality of second diodes 187 are each configured as a conventionally known semiconductor element. The plurality of first diodes 183 and the plurality of second diodes 187 are schematically shown in FIG. 2. The plurality of first diodes 183 and the plurality of second diodes 187 are each configured such that a voltage indicative of a certain voltage value is applied to the diode when the diode becomes conductive.

Quenching of superconducting coil 110 causes a current to flow through at least one of the plurality of first diodes 183 provided on first protection diode lead 182, and the plurality of second diodes 187 provided on second protection diode lead 186, via the pair of external leads 150. As a result, at least one of the plurality of first diodes 183 and the plurality of second diodes 187 generates heat, and energy is consumed.

As described above, in superconducting magnet 100 according to the first embodiment of the present invention, discharge pipe 140 is connected to refrigerant container 120 from outside of vacuum container 130, and discharges vaporized refrigerant 10. In addition, protection circuit 160 is electrically connected to superconducting coil 110, and consumes energy stored in superconducting coil 110 during quenching. Protection circuit 160 is in contact with discharge pipe 140 outside of vacuum container 130.

Accordingly, since protection circuit 160 is located outside of vacuum container 130, protection circuit 160 is easily assembled. In addition, since protection circuit 160 is in contact with discharge pipe 140 through which vaporized refrigerant 10G flows during quenching of superconducting magnet 100, protection circuit 160 is cooled during the quenching by discharge pipe 140 that has been cooled by sensible heat of vaporized 10G. This can eliminate the need for a member used only for heat exchange, thereby simplifying the configuration of protection circuit 160.

In addition, in the present embodiment, protection circuit 160 is wrapped around discharge pipe 140 outside of vacuum container 130. Accordingly, protection circuit 160 can be strongly and easily fixed to discharge pipe 140.

Second Embodiment

A superconducting magnet according to a second embodiment of the present invention is now described. The superconducting magnet according to the second embodiment of the present invention is mainly different from superconducting magnet 100 according to the first embodiment of the present invention in that the discharge pipe has a groove. Thus, a description of the configuration similar to that of superconducting magnet 100 according to the first embodiment of the present invention is not repeated.

Figure 3:
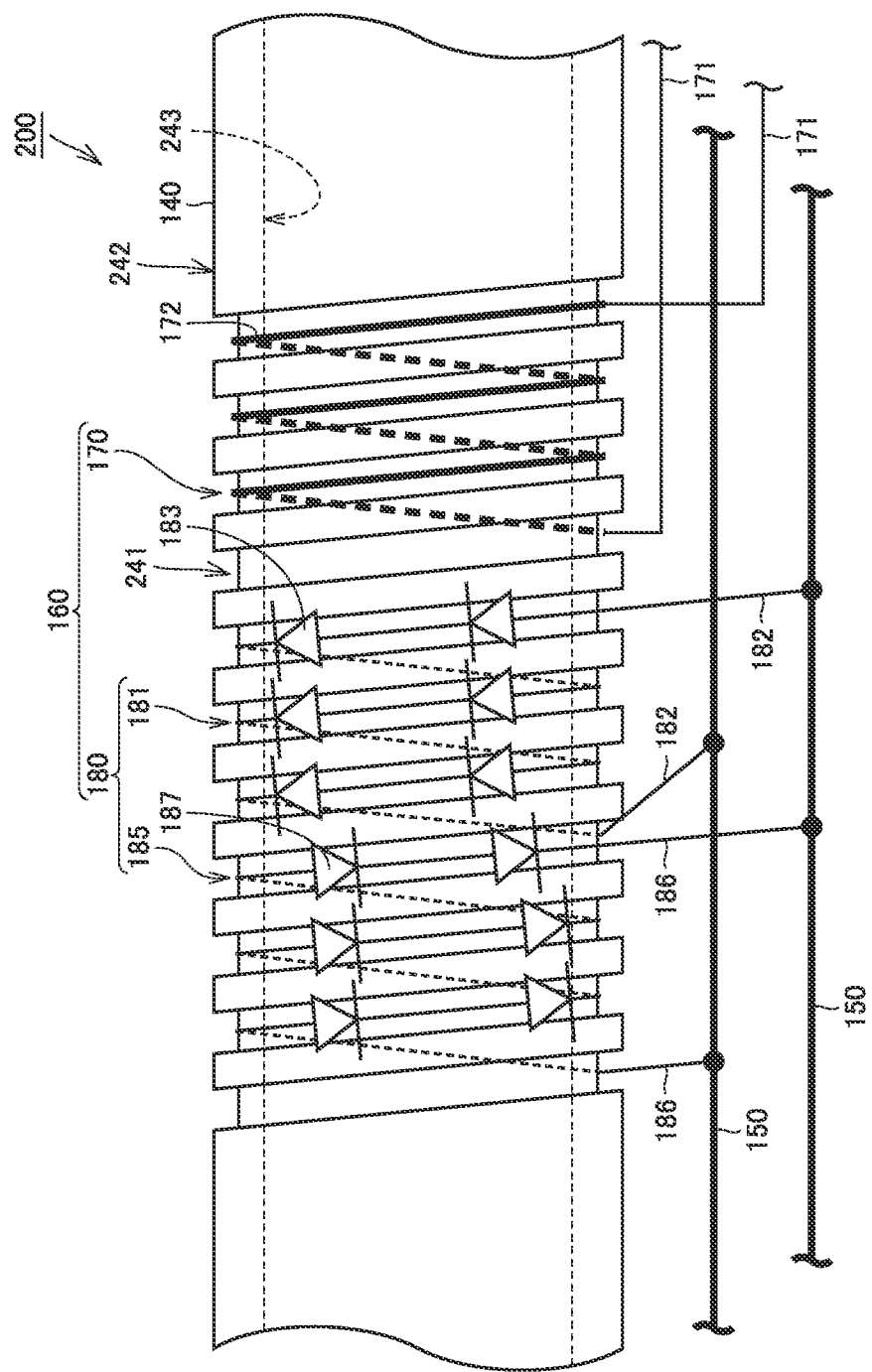
FIG. 3 is a partial enlarged view showing a portion of a configuration of a superconducting magnet according to a second embodiment of the present invention.

FIG. 3 is a partial enlarged view showing a portion of a configuration of the superconducting magnet according to the second embodiment of the present invention. FIG. 3 shows a portion corresponding to the portion of the configuration of superconducting magnet 100 according to the first embodiment of the present invention shown in FIG. 2.

As shown in FIG. 3, in superconducting magnet 200 according to the second embodiment of the present invention, discharge pipe 140 has a helical groove 241 formed on its outer circumferential surface, with a direction in which discharge pipe 140 extends as an axial direction of a central axis of the groove. Protection circuit 160 is wrapped around discharge pipe 140 so as to be located within groove 241.

In the portion where groove 241 is formed, discharge pipe 140 has a smaller thickness, causing an outer circumferential surface 242 and a pipe inner surface 243 of discharge pipe 140 to be closer to each other. Pipe inner surface 243 is directly cooled by sensible heat of vaporized refrigerant 10G. That is, the portion of outer circumferential surface 242 of discharge pipe 140 where groove 241 is formed is more likely to perform heat exchange than the other portions. Thus, protection circuit 160 and discharge pipe 140 located within groove 241 can exchange heat more efficiently, thus allowing for efficient cooling of protection circuit 160.

Groove 241 has a depth of 1 mm, for example, and the portion of discharge pipe 140 where groove 241 is formed has a thickness of 2 mm or more and 3 mm or less, for example. In addition, because discharge pipe 140 itself is fixed to superconducting magnet 100, groove 241 is preferably formed, outside of vacuum container 130, only in a central portion in the direction in which discharge pipe 140 extends. Groove 241 can be formed by, for example, cutting of discharge pipe 140, or casting and molding of discharge pipe 140.

In addition, in the present embodiment, flat resistance wire 172 is wrapped around discharge pipe 140 so as to be located within groove 241 of discharge pipe 140.

Accordingly, when compared to a round resistance wire, flat resistance wire 172 has a larger friction surface with discharge pipe 140, and therefore, misalignment of resistance wire 172 in the direction in which discharge pipe 140 extends can be suppressed. Further, the misalignment of resistance wire 172 in this extension direction can be suppressed by a sidewall of groove 241.

While the plurality of first diodes 183 and the plurality of second diodes 187 are each shown as protruding from groove 241 in FIG. 3, they are shown schematically, and the plurality of first diodes 183 and the plurality of second diodes 187 are each located within groove 241 in the present embodiment.

Third Embodiment

A superconducting magnet according to a third embodiment of the present invention is now described. The superconducting magnet according to the third embodiment of the present invention is mainly different from superconducting magnet 200 according to the second embodiment of the present invention in that a protection diode portion and a protection resistance portion are wrapped around the discharge pipe so as to form a double helix. Thus, a description of the configuration similar to that of superconducting magnet 200 according to the first embodiment of the present invention is not repeated.

Figure 4:
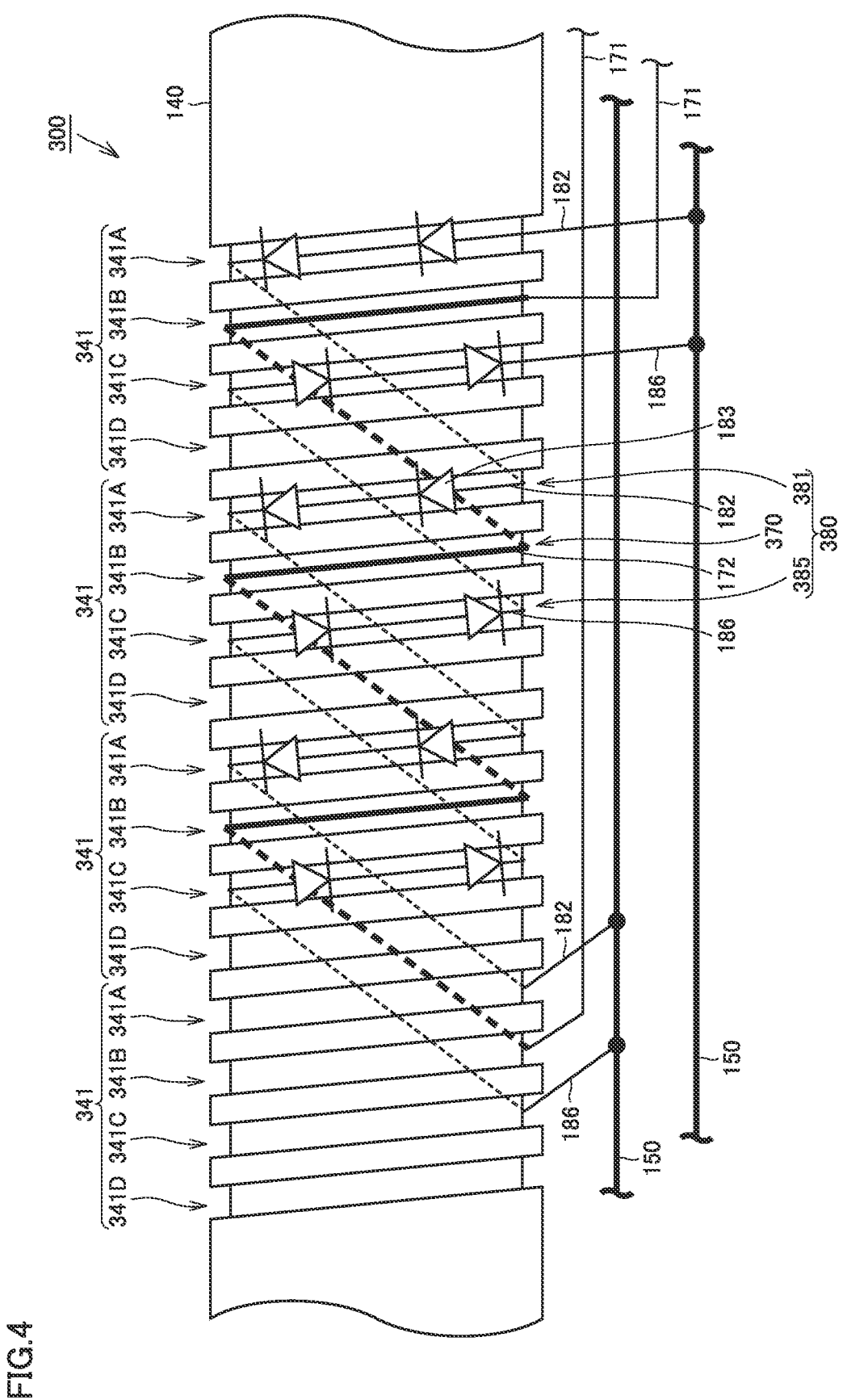
FIG. 4 is a partial enlarged view showing a portion of a configuration of a superconducting magnet according to a third embodiment of the present invention.

FIG. 4 is a partial enlarged view showing a portion of a configuration of the superconducting magnet according to the third embodiment of the present invention. FIG. 4 shows a portion corresponding to the portion of the configuration of the superconducting magnet according to the second embodiment of the present invention shown in FIG. 3.

In a superconducting magnet 300 according to the third embodiment of the present invention, a protection diode portion 380 is wrapped around discharge pipe 140 outside of vacuum container 130, so as to form a double helix together with a protection resistance portion 370.

Accordingly, on discharge pipe 140, protection resistance portion 370 and protection diode portion 380 which generate different amounts of heat are alternately arranged in the direction in which discharge pipe 140 extends. Thus, uniformity of heat generation in protection circuit 160 can be improved.

More specifically, a first protection diode portion 381, protection resistance portion 370, and a second protection diode portion 385 are successively arranged in the direction in which discharge pipe 140 extends. That is, first protection diode portion 381, protection resistance portion 370, and second protection diode portion 385 are wrapped around discharge pipe 140 so as to form a triple helix.

Further, in the present embodiment, a groove 341 is configured to form a quadruple helix. That is, groove 341 has a first groove 341A, a second groove 341B, a third groove 341C, and a fourth groove 341D, which are successively arranged in the direction in which discharge pipe 140 extends. First protection diode portion 381 is located within first groove 341A, protection resistance portion 370 is located within second groove 341B, and second protection diode portion 385 is located within third groove 341C.

In the description of the foregoing embodiments, configurations that can be combined with each other may be combined together.

It is noted that the embodiments disclosed herein are illustrative in every respect, and do not serve as a basis for restrictive interpretation. Therefore, the technical scope of the present invention should not be interpreted based on the foregoing embodiments only, but is defined by the terms of the claims. Further, any modifications within the meaning and scope equivalent to the terms of the claims are encompassed.

REFERENCE SIGNS LIST 10, 10G refrigerant; 100, 200, 300 superconducting magnet; 110 superconducting coil; 120 refrigerant container; 130 vacuum container; 140 discharge pipe; 150 external lead; 160 protection circuit; 170, 370 protection resistance portion; 171 resistance wire lead; 172 resistance wire; 180, 380 protection diode portion; 181, 381 first protection diode portion; 182 first protection diode lead; 183 first diode; 185, 385 second protection diode portion; 186 second protection diode lead; 187 second diode; 241, 341 groove; 242 outer circumferential surface; 243 pipe inner surface; 341A first groove; 341B second groove; 341C third groove; 341D fourth groove.

The invention claimed is:

1. A superconducting magnet comprising:
a superconducting coil;
a refrigerant container to contain the superconducting coil in a state where the superconducting coil is immersed in a liquid refrigerant;
a vacuum container to contain the refrigerant container;
a discharge pipe connected to the refrigerant container from outside of the vacuum container, the discharge pipe discharging the refrigerant that has been vaporized;
a pair of external leads electrically connected respectively to opposite ends of the superconducting coil from a position outside of the vacuum container, so as to cause a current to flow through the superconducting coil; and
a protection circuit electrically connected to the superconducting coil, the protection circuit consuming energy stored in the superconducting coil during quenching,
the protection circuit being in contact with the discharge pipe outside of the vacuum container, wherein
the protection circuit is wrapped around the discharge pipe outside of the vacuum container,
the discharge pipe has a helical groove formed on its outer circumferential surface, with a direction in which the discharge pipe extends as an axial direction of a central axis of the groove, and
the protection circuit is wrapped around the discharge pipe so as to be located within the groove.

2. The superconducting magnet according to claim 1, wherein
the protection circuit includes a protection resistance portion to electrically connect two locations of the superconducting coil that are spaced from each other, and
the protection resistance portion has a flat resistance wire wrapped around the discharge pipe so as to be located within the groove of the discharge pipe.

3. The superconducting magnet according to claim 1, wherein
the protection circuit includes a protection resistance portion to electrically connect two locations of the superconducting coil that are spaced from each other, and a protection diode portion to electrically connect the pair of external leads to each other,
the protection resistance portion is wrapped around the discharge pipe outside of the vacuum container, and
the protection diode portion is wrapped around the discharge pipe outside of the vacuum container, so as to form a double helix together with the protection resistance portion.

* * * * *